United States Patent
Seyedi et al.

(10) Patent No.: US 11,114,409 B2
(45) Date of Patent: Sep. 7, 2021

(54) CHIP ON WAFER ON SUBSTRATE OPTOELECTRONIC ASSEMBLY AND METHODS OF ASSEMBLY THEREOF

(71) Applicant: Hewlett Packard Enterprise Development LP, Houston, TX (US)

(72) Inventors: Mir Ashkan Seyedi, Palo Alto, CA (US); Marco Fiorentino, Fiorentino, CA (US)

(73) Assignee: Hewlett Packard Enterprise Development LP, Houston, TX (US)

(*) Notice: Subject to any disclaimer, the term of this patent is extended or adjusted under 35 U.S.C. 154(b) by 0 days.

(21) Appl. No.: 16/777,569

(22) Filed: Jan. 30, 2020

(65) Prior Publication Data

US 2021/0242168 A1 Aug. 5, 2021

(51) Int. Cl.
| H01L 21/56 | (2006.01) |
| H01L 23/00 | (2006.01) |
| H01L 23/498 | (2006.01) |
| H01L 23/31 | (2006.01) |
| H01L 21/48 | (2006.01) |

(52) U.S. Cl.
CPC .......... H01L 24/94 (2013.01); H01L 21/486 (2013.01); H01L 21/563 (2013.01); H01L 23/3114 (2013.01); H01L 23/49861 (2013.01); H01L 24/29 (2013.01); H01L 24/83 (2013.01)

(58) Field of Classification Search
CPC ................. H01L 21/563; H01L 21/31051
See application file for complete search history.

(56) References Cited

U.S. PATENT DOCUMENTS

| 9,385,110 B2 * | 7/2016 | Yeh ................. H01L 25/0655 |
| 2018/0190638 A1 * | 7/2018 | Chen ................. H01L 25/0652 |

* cited by examiner

*Primary Examiner* — Nicholas J Tobergte
(74) *Attorney, Agent, or Firm* — Hewlett Packard Enterprise Patent Department

(57) ABSTRACT

Examples herein relate to optoelectronic assemblies. In particular, implementations herein relate to an optoelectronic assembly formed via a chip on wafer on substrate (CoWoS) process. The optoelectronic assembly includes a substrate, an interposer, and an electronic integrated circuit (EIC). Each of the substrate, interposer, and EIC includes opposing first and second sides. The EIC is flip-chip assembled to the first side of the interposer, and the interposer with the EIC assembled thereto is flip-chip assembled to the first side of the substrate. An overmold layer extends over the first side of the interposer and encapsulates the EIC. The overmold layer includes a cavity such that a region of the first side of the interposer is exposed. An optical component is positioned within the cavity and coupled to the first side of the interposer.

10 Claims, 6 Drawing Sheets

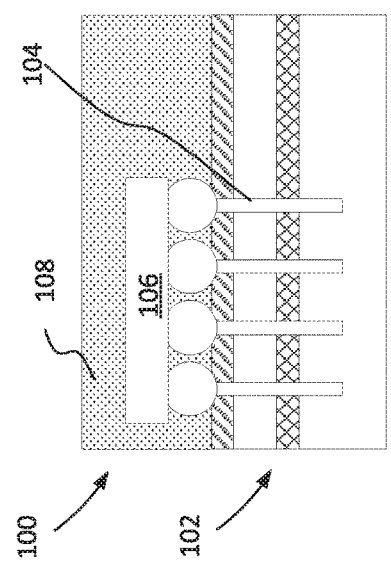
Figure 1C
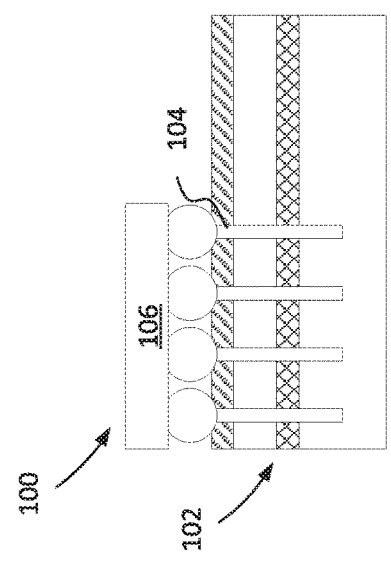
Figure 1B
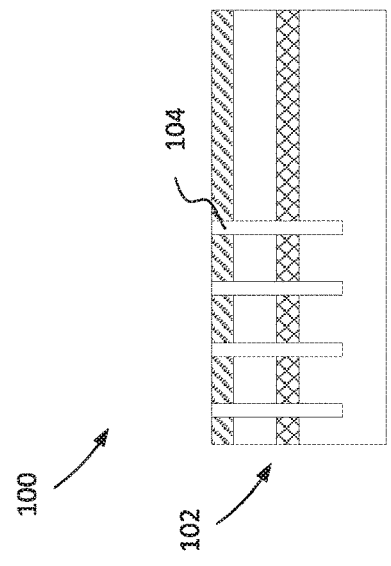
Figure 1A
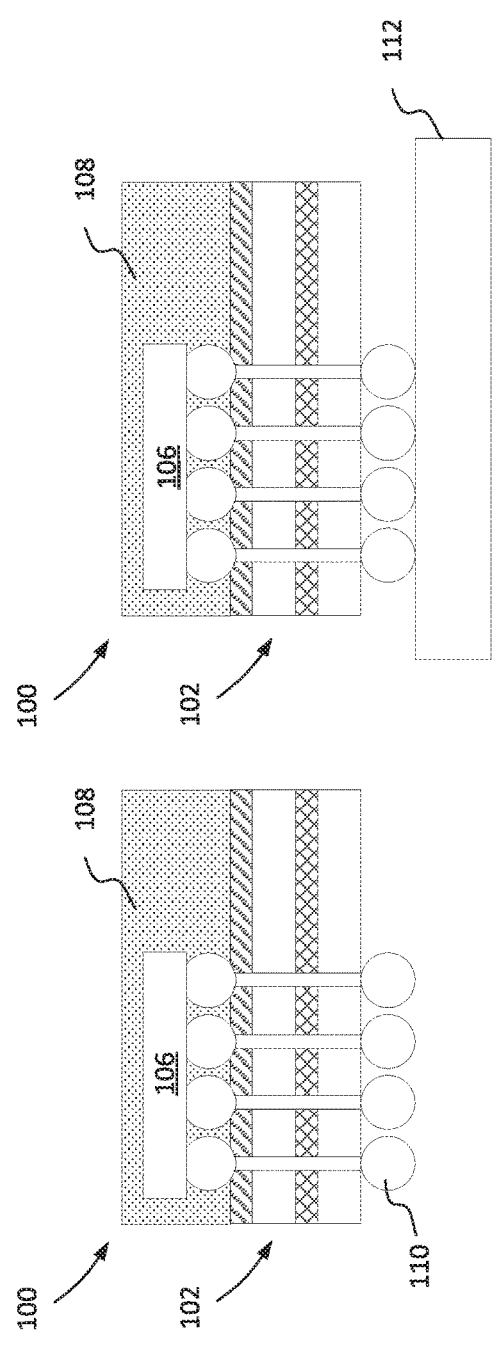
Figure 1E
Figure 1D

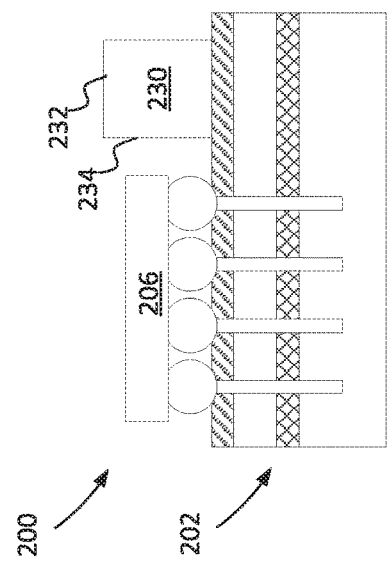
Figure 2C
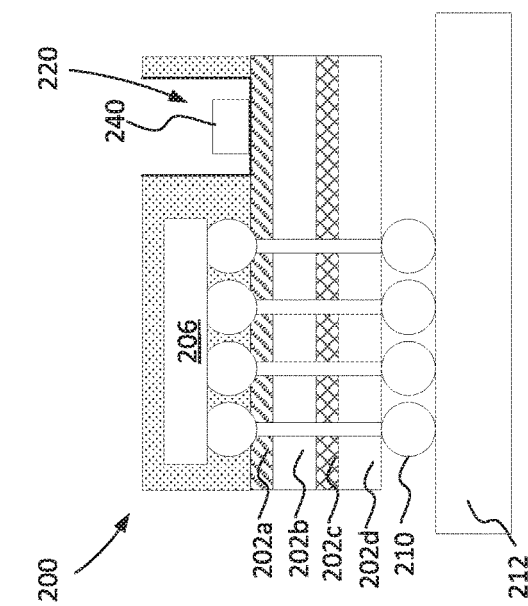
Figure 2F
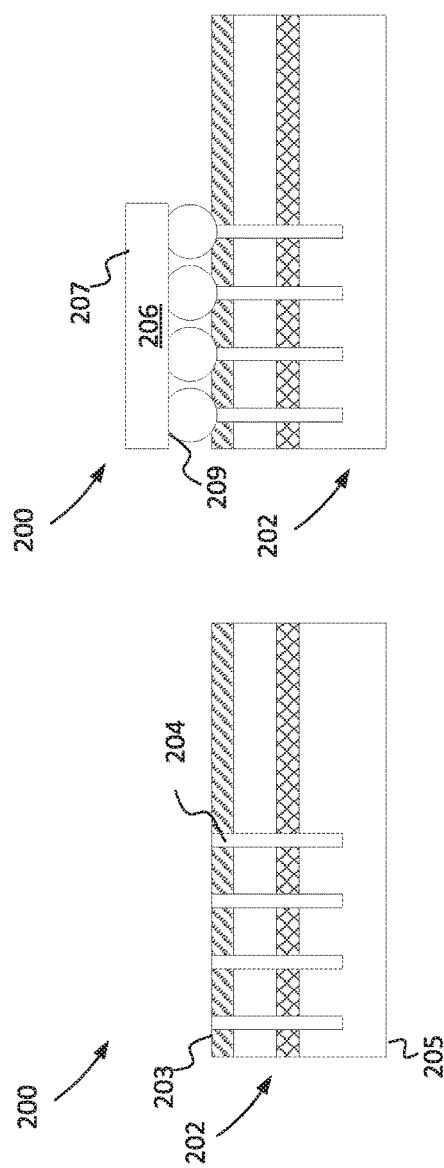
Figure 2B
Figure 2E
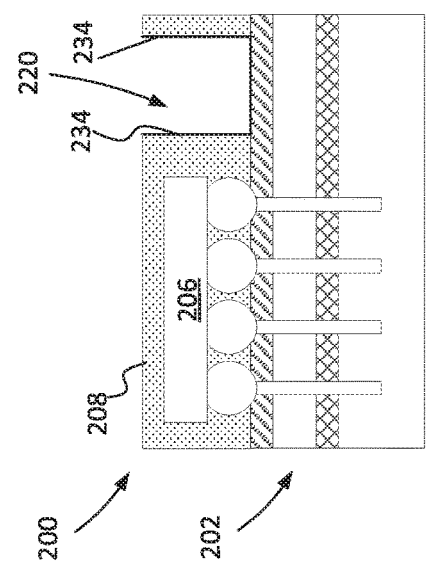
Figure 2A
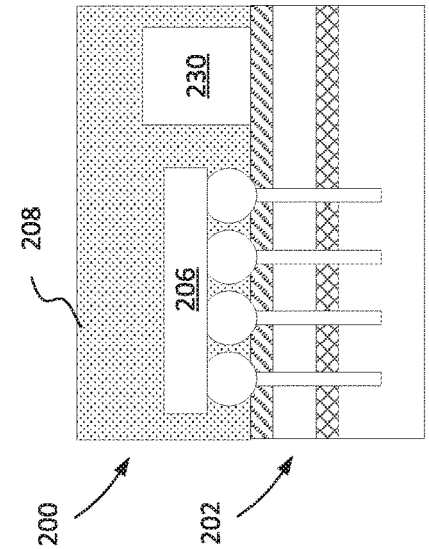
Figure 2D

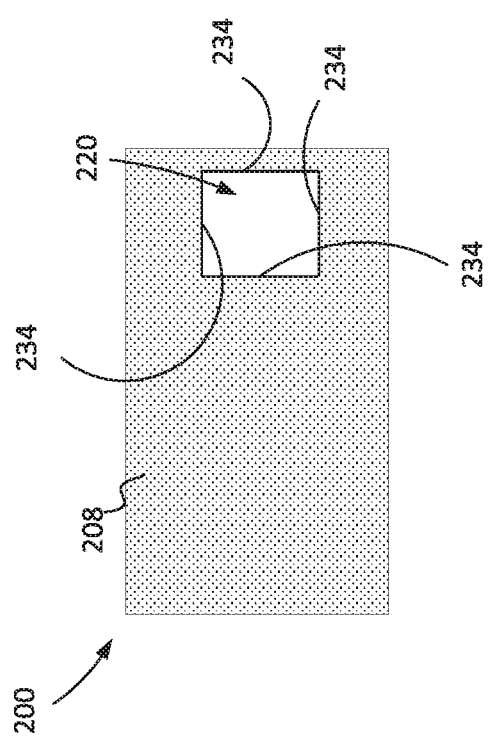

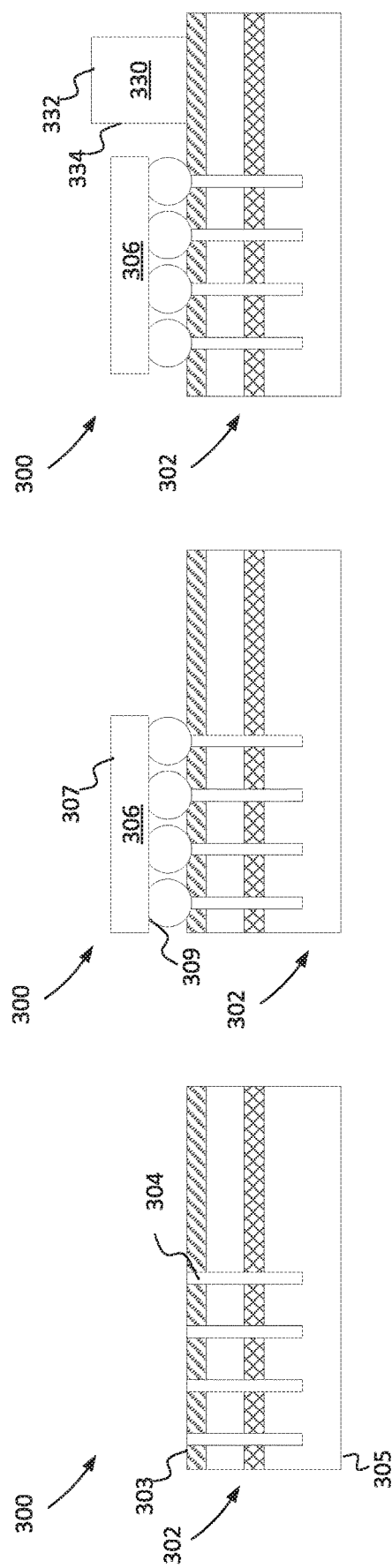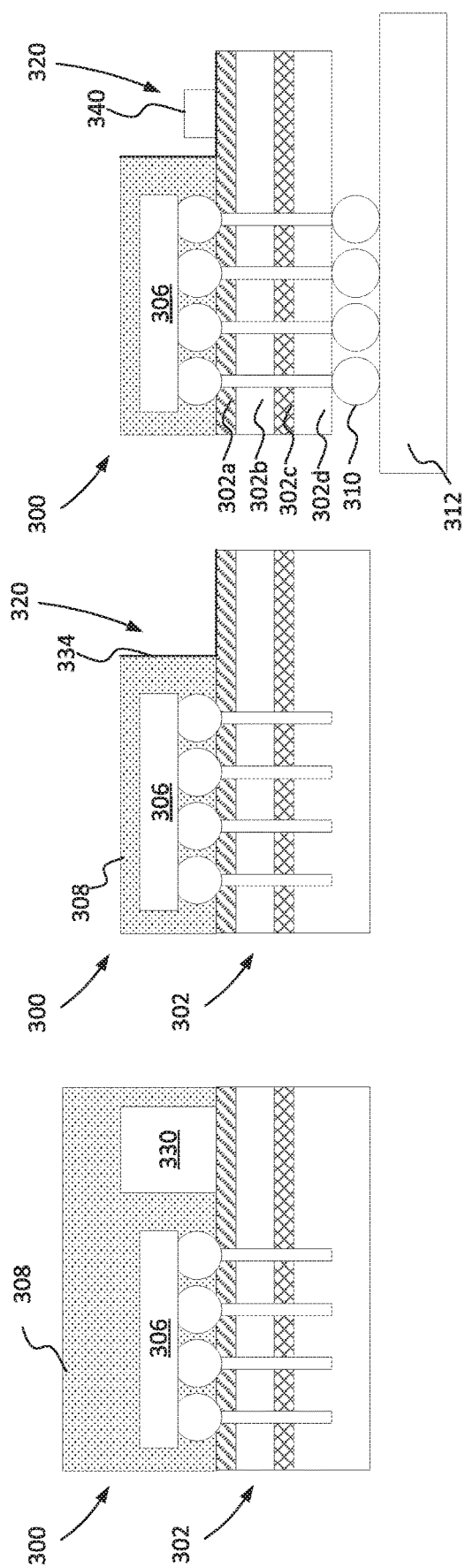

CHIP ON WAFER ON SUBSTRATE OPTOELECTRONIC ASSEMBLY AND METHODS OF ASSEMBLY THEREOF

BACKGROUND

Optoelectronic communication (e.g., using optical signals to transmit electronic data) is becoming more prevalent as a potential solution, at least in part, to the ever increasing demand for high bandwidth, high quality, and low power consumption data transfer in applications such as high performance computing systems, large capacity data storage servers, and network devices. Improvements to existing chip on wafer on substrate packaging schemes are necessary to provide co-packaged optoelectronic assemblies integrated on an interposer with top-down optical input/output attachment.

BRIEF DESCRIPTION OF THE DRAWINGS

Certain examples are described in the following detailed description and in reference to the drawings, in which:

FIGS. 1A-1E schematically illustrate various steps of an example of a conventional chip on wafer on substrate process flow;

FIG. 2A-2F schematically illustrate various steps of forming an example optoelectronic assembly via chip on wafer on substrate packaging according to the present disclosure and FIG. 2G is a top view of the optoelectronic assembly;

FIGS. 3A-3F schematically illustrates various steps of forming another example optoelectronic assembly via chip on wafer on substrate packaging according to the present disclosure and FIG. 3G is a top view of the optoelectronic assembly.

DETAILED DESCRIPTION OF SPECIFIC EXAMPLES

Figure 3G:
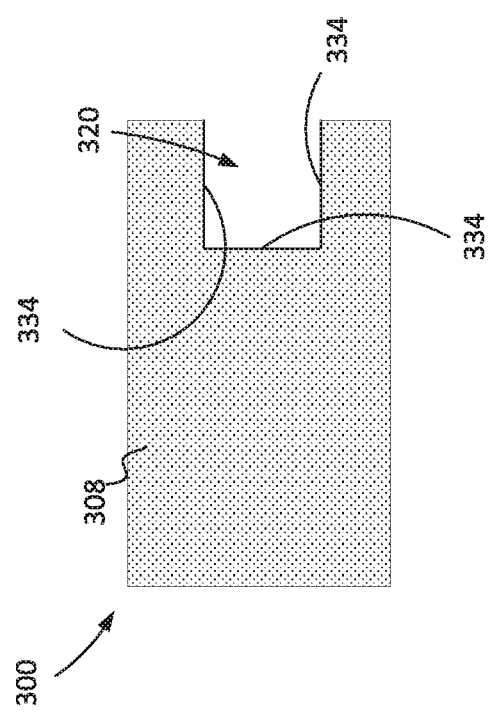

The present disclosure describes various examples of optoelectronic assemblies and methods of forming the optoelectronic assemblies thereof. In particular, implementations herein relate to an optoelectronic assembly formed via a chip on wafer on substrate (CoWoS) process. The optoelectronic assembly includes a substrate, an interposer, and an electronic integrated circuit (EIC). Each of the substrate, interposer, and EIC includes opposing first and second sides. The EIC is flip-chip assembled to the first side of the interposer, and the interposer with the EIC assembled thereto is flip-chip assembled to the first side of the substrate. An overmold layer extends over the first side of the interposer and encapsulates the EIC. The overmold layer includes a cavity such that a region of the first side of the interposer is exposed. An optical component is positioned within the cavity and coupled to the first side of the interposer. The cavity in the overmold layer exposes a region of the first side of the interposer and is configured to allow optical input/output (I/O) in or out of the optical component through the exposed region of the first side of the interposer.

The interposer can be constructed of silicon or other suitable materials with a relatively high-index of refraction (e.g., GaAs, GaP, GaN, InP). The interposer is disposed over or above the substrate. As described herein, the "substrate" can refer to an organic build-up substrate, another interposer, or a circuit board (e.g., a PCB) depending on the application. Further, the interposer includes through substrate vias (TSVs) to form electrical paths between the EIC and the substrate thereunder.

An "optical component" as described herein can refer to an optical socket (e.g., to enable optical fiber ferrule attachment), lenses or mirrors, isolators, or other optical I/O components. An "optical fiber" as described herein can refer to a single optical fiber (e.g., including a core and a cladding) to provide unidirectional or bidirectional optical communication, can refer to a bidirectional pair of optical fibers (e.g., each including a core and a cladding) to provide both transmit and receive communications in an optical network, or can refer to a multi-core fiber, such that a single cladding could encapsulate a plurality of single-mode cores.

FIGS. 1A-1E illustrates various steps of an example of a conventional chip on wafer on substrate (CoWoS) process flow 100. As illustrated in FIG. 1A, an interposer 102 having opposing first and second sides is fabricated with TSVs 104 extending therethrough. In FIG. 1B, an EIC 106 having opposing first and second sides is flip-chip assembled to the first side of the interposer 102. Using corresponding solder pads and microbumps (e.g., a solder reflow process), the EIC 106 is passively aligned and coupled to the first side of the interposer 102. As illustrated in FIG. 1C, a non-optically transparent overmold layer 108 is then deposited on the first side of the interposer 102. The overmold layer 108 extends over or on the entire or substantially entire first side of the interposer 102, encapsulating the EIC 106. The overmold layer 108 is subsequently planarized and cured or otherwise hardened (FIG. 1D). The overmold layer 108 provides structural or mechanical stability to the EIC/interposer assembly during subsequent packaging or other process flow steps. The second side of the interposer 102 is thinned to expose the TSVs 104 and solder bumps 110 formed thereon. The interposer 102 with the EIC 106 flip-chipped assembled thereto is then flip-chip assembled to a first side of a substrate 112 (FIG. 1E). As illustrated in FIG. 1E, optical 10 cannot be implemented through the first side of the interposer 102 because the non-optically transparent overmold layer 108 covers the first side of the interposer 102.

With reference to FIGS. 2A-2F, various steps of forming an example optoelectronic assembly 200 via CoWoS packaging techniques according to the present disclosure is illustrated. Optoelectronic assembly 200 can include any features or steps in whole or in part as described above with respect to process flow 100. In contrast, optoelectronic assembly 200 includes a cavity 220 exposing a region of a first side of an interposer 202 as described in further detail below.

As illustrated in FIGS. 2A-2B, the interposer 202 having opposing first and second sides 203 and 205 is fabricated with TSVs 204 extending therethrough. In FIG. 2B, an EIC 206 having opposing first and second sides 207 and 209 is flip-chip assembled to the first side 203 of the interposer 202. Using corresponding solder pads and microbumps (e.g., a solder reflow process), the EIC 206 is passively aligned and coupled to the first 203 side of the interposer 202.

In FIG. 2C, an enclosure 230 is coupled or otherwise attached to the first side 203 of the interposer 202 with an adhesive (e.g., an epoxy) via for example, pick-and-place tools. The enclosure 230 can include a lid 232 or cover and four sidewalls 234, the enclosure 230 having an open side facing down or towards the first side 203 of the interposer 202. A height of the enclosure 230 is greater than a height of the EIC 206 (e.g., the lid 232 is at a higher elevation above the first side 203 of the interposer 202 relative to a first side 207 of the EIC 206. The enclosure 230 can be formed of silicon or other suitable material.

As illustrated in FIG. 2D, a non-optically transparent overmold layer 208 is deposited over the first side 203 of the interposer 202 and encapsulating the EIC 206. The overmold layer 208 is cured or otherwise hardened. In FIG. 2E, the overmold layer 208 is planarized (e.g., via chemical-mechanical polishing). During the planarization of the overmold layer 208, the lid 232 of the enclosure 230 is polished off or otherwise removed as well (e.g., because the lid 232 is taller or at a greater height relative to the EIC 206). Removing the lid 232 of the enclosure 230 forms the cavity 220 enclosed on four sides by the four sidewalls 234 of the enclosure 230 (FIGS. 2E-2G) within or extending through the overmold layer 208 to the first side 203 of the interposer 202. FIG. 2G illustrates a top view of the optoelectronic assembly 200. As illustrated, the cavity 220 can have a rectangular or square cross-sectional configuration enclosed or bounded by the four sidewalls 234. Other than the cavity 220, the rest of the interposer 202 is protected or covered with the overmold layer 208.

The cavity 220 exposes the region of the first side 203 of the interposer 202 allowing optical I/O via top-down attachment to the interposer 202 (e.g., through the first side 203). For example, as illustrated in FIG. 2F, an optical component 240 can be positioned within the cavity 220 of the overmold layer 208 and coupled to the first side 203 of the interposer 202. As described above, the optical component 240 can include, but is not limited to, an optical socket (e.g., to enable optical fiber ferrule attachment), lenses or mirrors, or isolators. Optical signals from or to the optical component 240 can enter to or exit from an optical layer of the interposer 202 through the first side 203 of the interposer 202.

The interposer 202 can include multiple layers. For example, the interposer 202 can include one or more of the following: a redistribution layer 202a including one or both of a passivation layer and metallization layer, an optical layer 202b (e.g., silicon optical layer), a buried oxide layer 202c, and/or a bulk layer 202d (e.g., a silicon bulk layer). The optical layer 202b can include one or more gratings to redirect the optical signals through the optical layer 202b from or to the optical component 240. Further, as described above with respect to the process flow 100, the interposer 202 with EIC flip-chip assembled thereto and exposed region can be thinned to expose the TSVs 204 and further flip-chip assembled or otherwise coupled to a first side of a substrate 212 (e.g., via corresponding solder pads and bumps and a solder reflow process).

FIGS. 3A-3F schematically illustrates various steps of forming another example optoelectronic assembly 300 via chip on wafer on substrate packaging according to the present disclosure. The optoelectronic assembly 300 is formed in an identical or similar manner as optoelectronic assembly 200 and can include any features or steps in whole or in part as described above with respect to optoelectronic assembly 200. However, after planarization of the overmold layer 308 and removal of the lid 332, a sidewall of the four sidewalls 334 can be cleaved or otherwise removed. The remaining three sidewalls 334 of the enclosure 330 form a cavity 320 with a U-shaped cross-sectional configuration (FIG. 3G). By removing an outer edge or sidewall 334 of the enclosure 330, an exposed edge of the interposer 302 can then be etched (e.g., during post-processing steps) to, for example, create a v-shaped groove for optical fiber attachment. As illustrated, an outer edge of the interposer 302 is exposed such that the edge of layers of the interposer 302 are accessible to be etched or otherwise processed.

Figure 4B:
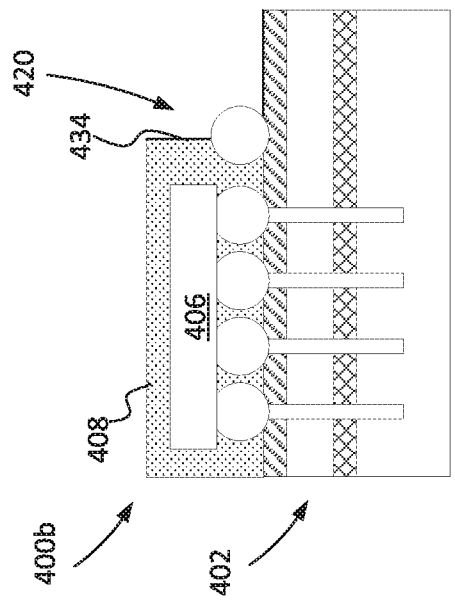
FIGS. 4A-4B schematically illustrate section views of other examples of optoelectronic assemblies according to the present disclosure.
Figure 4A:
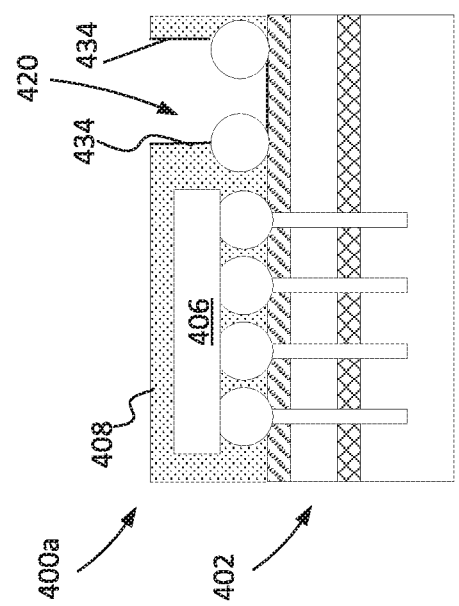

FIGS. 4A-4B schematically illustrate section views of other examples of optoelectronic assemblies 400a and 400b, respectively, according to the present disclosure. Optoelectronic assemblies 400a and 400b can include any features or steps in whole or in part as described above with respect to optoelectronic assemblies 200 and 300. For example, optoelectronic assemblies 400a and 400b illustrate enclosures 430 having a cavity 420 with a square-shaped cross-sectional configuration and a U-shaped cross-sectional configuration, respectively, formed as described above with respect to optoelectronic assemblies 200 and 300. In contrast, optoelectronic assemblies 400a and 400b illustrate enclosures 430 coupled to the first side 403 of the interposer 402 without adhesive or epoxy. In FIGS. 4A-4B, the respective enclosures 430 of optoelectronic assemblies 400a and 400b are coupled or attached using corresponding microbumps and pads (e.g., a solder reflow process). In such implementations, the enclosures 430 can be simultaneously coupled to the first side 403 of the interposer 402 with the EIC 406. In other implementations, the enclosures 430 to form the cavities 420 can be coupled to the interposer 402 before or after the EIC 406.

In the foregoing description, numerous details are set forth to provide an understanding of the subject disclosed herein. However, implementations may be practiced without some or all of these details. Other implementations may include additions, modifications, or variations from the details discussed above. It is intended that the appended claims cover such modifications and variations. The specification and drawings are, accordingly, to be regarded as illustrative rather than restrictive. Additionally, in the interest of clarity and to avoid unnecessarily obscuring the description, other details describing well-known structures and systems often associated with optoelectronic assemblies (e.g., contact pads, traces between pads, driver circuitry, ASICs, gratings, etc.), have not been set forth herein in the description of the various examples of the present disclosure.

It will be recognized that the terms "comprising," "including," and "having," as used herein, are specifically intended to be read as open-ended terms of art. The term "or," in reference to a list of two or more items, covers all of the following interpretations of the word: any of the items in the list, all of the items in the list, and any combination of the items in the list. As used herein, the terms "connected," "coupled," or any variant thereof means any connection or coupling, either direct or indirect (e.g., having additional intervening components or elements), between two or more elements, nodes, or components; the coupling or connection between the elements can be physical, mechanical, logical, optical, electrical, or a combination thereof.

In the Figures, identical reference numbers identify identical, or at least generally similar, elements. To facilitate the discussion of any particular element, the most significant digit or digits of any reference number refers to the Figure in which that element is first introduced. For example, element 110 is first introduced and discussed with reference to FIG. 1.

The invention claimed is:
1. A method of assembling an optoelectronic assembly via a CoWos process, the method comprising:
   fabricating an interposer with TSVs, the interposer having opposing first and second sides;

flip-chip assembling an electronic integrated circuit (EIC) having opposing first and second sides to the first side of the interposer;

coupling an enclosure to the first side of the interposer, the enclosure having a lid and four sidewalls, and a height greater than a height of the EIC;

depositing an overmold layer on the first side of the interposer, the overmold layer encapsulating the EIC;

planarizing the overmold layer, wherein the lid of the enclosure is removed during planarization of the overmold layer, the four sidewalls of the enclosure forming a cavity extending through the overmold layer and exposing a region of the first side of the interposer;

coupling an optical component to the first side of the interposer within the formed cavity; and flip-chip assembling the interposer to a first side of a substrate.

2. The method of assembling an optoelectronic assembly of claim 1, wherein the enclosure is coupled to the first side of the interposer with an adhesive.

3. The method of assembling an optoelectronic assembly of claim 1, wherein the enclosure is coupled to the first side of the interposer with a solder reflow process.

4. The method of assembling an optoelectronic assembly of claim 1, wherein the cavity has a rectangular cross-sectional configuration.

5. The method of assembling an optoelectronic assembly of claim 1, further comprising cleaving one sidewall of the four sidewalls of the enclosure after removing the lid such that the cavity has a U-shaped cross-sectional configuration.

6. The method of assembling an optoelectronic assembly of claim 1, wherein the enclosure positioned on the first side of the interposer via pick-and-place tools.

7. The method of assembling an optoelectronic assembly of claim 1, wherein the enclosure and the EIC are coupled to the first side of the interposer simultaneously during a solder reflow process.

8. The method of assembling an optoelectronic assembly of claim 1, wherein the interposer is flip-chip assembled to the substrate after the planarization of the overmold layer.

9. The method of assembling an optoelectronic assembly of claim 1, wherein the first and second sides of the EIC and the interposer are top and bottom sides, respectively.

10. The method of assembling an optoelectronic assembly of claim 1, wherein the TSVs extend from the first side to the second side of the interposer to couple the EIC to the first side of the substrate.

* * * * *